United States Patent [19]

Besserer

[11] Patent Number: 6,010,023
[45] Date of Patent: Jan. 4, 2000

[54] SMALL HOUSING

[75] Inventor: Horst Besserer, Heborn, Germany

[73] Assignee: Rittal-Werk Rudolf Loh GmbH & Co. KG, Herborn, Germany

[21] Appl. No.: 09/031,139

[22] Filed: Feb. 26, 1998

[30] Foreign Application Priority Data

Feb. 26, 1997 [DE] Germany .................... 197 07 679

[51] Int. Cl.[7] ...................................................... B65D 6/00
[52] U.S. Cl. ......................... 220/4.21; 220/4.01; 220/699
[58] Field of Search ................................. 220/3.92, 3.94, 220/3.6, 4.01, 4.02, 4.09, 4.24, 4.32, 4.33, 699, 4.26, 4.27, 3.9, 480, 481; 403/381, 395; 174/58; 361/807, 809, 810, 752, 756, 796, 797, 802

[56] References Cited

U.S. PATENT DOCUMENTS

| 2,886,201 | 5/1959 | Dickey | 220/3.6 |
|---|---|---|---|
| 4,109,294 | 8/1978 | Mason et al. | 361/752 |
| 4,754,944 | 7/1988 | Bovermann | 220/3.9 X |
| 5,378,854 | 1/1995 | Hoover | 220/3.92 X |

FOREIGN PATENT DOCUMENTS

| 1080655 | 7/1956 | Germany | 174/858 |

Primary Examiner—Allan N. Shoap
Assistant Examiner—Joe Merek
Attorney, Agent, or Firm—Pauley Petersen Kinne & Fejer

[57] ABSTRACT

A small housing having a lower housing element, a housing cover and two front plates, wherein the lower housing element and the housing cover are embodied as sections of extruded profiles of a U-shaped cross section. The front plates close off the open front faces of the assembled housing, and the lower housing element is connected with the housing cover. The lower housing element has attachment elements for placing the small housing on an attachment surface. A simplified attachment of the small housing on a attachment surface is achieved with longitudinally oriented and undercut attachment strips formed on the exteriors of the lateral walls of the lower housing element. Attachment clamps, which are U-shaped in cross section and which have an undercut receptacle for the attachment strip can be fixed on the attachment strips. Lateral legs of the attachment clamp which delimit the receptacle are provided outside of the received attachment strip with attachment receptacles, for an attachment screw, which are aligned with each other.

17 Claims, 1 Drawing Sheet

SMALL HOUSING

BACKGROUND OF THE INVENTION

1. Field of the Invention

This invention relates to a small housing having a lower housing element, a housing cover and two front plates, wherein the lower housing element and the housing cover are embodied as sections of extruded profiles having a U-shaped cross section, wherein the front plates close off the open front faces of the assembled housing, and the lower housing element is connected with the housing cover, and wherein the lower housing element has attachment elements for placing the small housing on an attachment surface.

2. Description of Prior Art

In a known small housing of this type, projecting attachment flanges are formed on lateral legs of a lower housing element and have several attachment receptacles, for example attachment bores or attachment slits, for accommodating attachment screws. The fixed placement of the attachment points on the attachment flanges has one disadvantage that it is necessary to also provide correspondingly distributed attachment receptacles, such as threaded bores, for example, in the attachment surface on which the small housing is fastened. This makes the universal and rapid attachment of the small housing on differently shaped attachment surfaces more difficult.

SUMMARY OF THE INVENTION

It is one object of this invention to provide a small housing of the type mentioned at the outset in such a way that the small housing can have variable attachment elements in a simple manner and therefore can be rapidly attached to differently laid out attachment surfaces.

In accordance with this invention this object is attained with attachment means designed as longitudinally oriented and undercut attachment strips formed on the exteriors of the lateral walls of the lower housing element. Attachment clamps, which are U-shaped in cross section and have an undercut receptacle for the attachment strip can be fixed on the attachment strips. Lateral legs of the attachment clamp which delimit the receptacle are provided outside of the received attachment strip with attachment receptacles for an attachment screw, which are aligned with each other.

The attachment points can be displaced to any arbitrary location along a longitudinal direction of the small housing with the aid of the formed-on attachment strips on the lower housing element and the attachment clamps. In the simplest case the attachment clamp is clamped to the attachment strip by the attachment screw and the attachment point is positioned in this way. The number and distribution of the attachment points can be arbitrarily selected here, which considerably simplifies the mounting of the small housing on an attachment surface.

The attachment clamps can be designed in such a way that the attachment clamps can be pushed on the attachment strip in the longitudinal direction of the attachment strip, or in such a way that the attachment clamps can be lockingly fastened on the attachment strips in the transverse direction of the attachment strip.

In one embodiment the attachment receptacles in the lateral legs of the attachment clamp are attachment bores and the attachment screws can pass through the lateral legs of the attachment clamps and can be directly screwed together with the attachment surface.

A more flexible adaptation of the attachment points of the small housing to preselected attachment receptacles of the attachment surface can be achieved in accordance with a further embodiment because the attachment receptacles in the lateral legs of the attachment clamp are designed as attachment holes each with a longitudinal dimension oriented transversely with respect to the longitudinal direction of the attachment strip.

An improvement of the clamping of the attachment clamp on the attachment strip is achieved with at least one attachment receptacle in the lateral legs of the attachment clamp being embodied as a threaded bore.

In accordance with a further embodiment, the attachment strips are arranged at a distance from the exterior of the bottom of the lower housing element. The thickness of at least one of the lateral legs of the attachment clamp is of such a size that the attachment clamp ends flush with the exterior of the bottom of the lower housing element. Then the attachment clamps are also seated flush with the attachment surface.

Countersunk arrangement of the attachment screws is achieved in a simple way in that the attachment receptacle of a lateral leg has a recess on its exterior with an enlarged cross section for the countersunk reception of a screw head of an attachment screw.

For closing the small housing, the lower housing element and the housing cover have on their interiors longitudinally oriented screw channels, and the front plates are screwed together with the screw channels of the housing cover, when it is placed on the lower housing element.

A sufficiently secure attachment of the attachment clamps applied to the attachment strips is obtained in that the attachment strips are embodied as dovetailed strips and the receptacle in the attachment clamps as a dovetailed groove with a deepened groove bottom.

BRIEF DESCRIPTION OF THE DRAWINGS

This invention will be explained in more detail by means of an exemplary embodiment represented in the drawings, wherein.

DETAILED DESCRIPTION OF THE PREFERRED EMBODIMENTS

Figure 1:
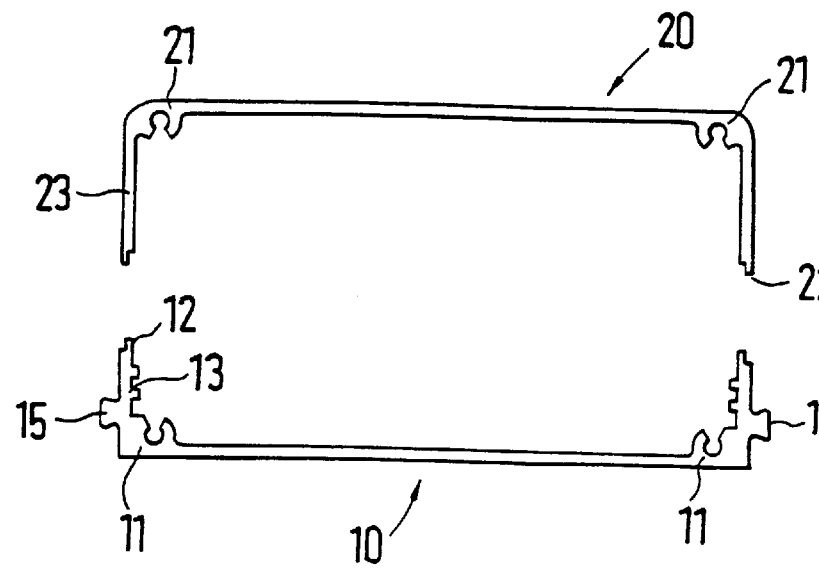
FIG. 1 is a plan view of a front of a lower housing element and a housing cover in an assembled position.

As shown in FIG. 1, the lower housing element 10 and the housing cover 20 are U-shaped in cross section and are embodied as sections of appropriately extruded profiles. In the transitions from the bottom, or respectively the cover, to the lateral wall, the lower housing element 10 has longitudinally oriented continuous screw channels 11, and the housing cover 20 has longitudinally oriented continuous screw channels 21. The lateral walls 13 of the lower housing element 10 terminate in inwardly offset interior connection strips 12, and the lateral walls 23 of the housing cover 20 in outwardly offset exterior connection strips 22. In this way both elements can be pushed flush into each other. The small housing preassembled in this manner is closed by means of two front plates of an appropriate shape, which are screwed together with the screw channels 11 and 21 of the housing elements which are pushed into each other.

Longitudinally oriented, undercut attachment strips 15 are formed on the exteriors of the lateral walls 13 of the lower housing element 10 and are preferably embodied as dovetailed strips 15. The attachment strips 15 are at a distance from the exterior of the bottom of the lower housing element 10.

Figure 2:
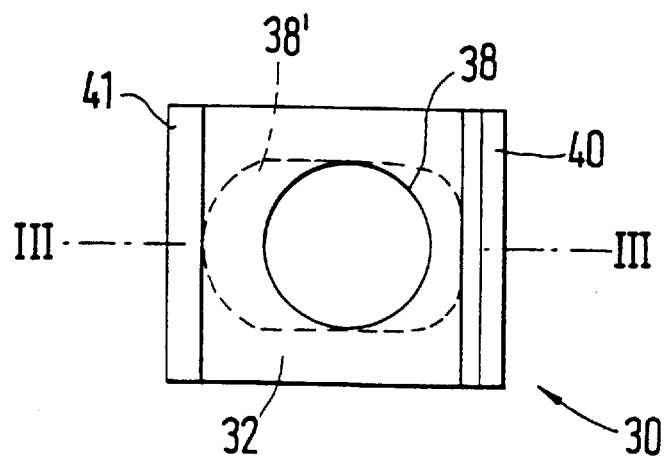
FIG. 2 is an enlarged plan view of an underside of an attachment clamp.
Figure 3:
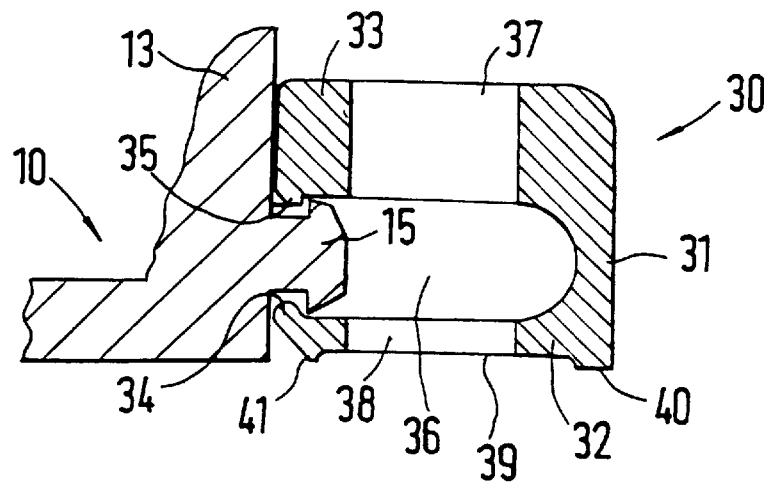
FIG. 3 is a section view taken through the attachment clamp along line III—III, as shown in FIG. 2.

U-shaped attachment clamps 30, as shown in FIGS. 2 and 3, are mounted on the attachment strips 15 of the small housing. The layout here can be such that the attachment clamps 30 are pushed on the attachment strips 15 in the longitudinal direction of the attachment strips 15. But the layout can also be such that the lateral legs 32 and 33 of the attachment clamp 30 are so resilient that the attachment clamp 30 can be lockingly fastened on the attachment strips 15 transversely with respect to the attachment strips 15. The attachment clamps 30 are captively, but freely displaceably held on the attachment strips 15. For security, the front plates, not shown, cover the front faces of the attachment strips 15 at the front sides of the small housing and protrude past the front sides, forming detents for the displaceable attachment clamps 30.

As the sectional view in accordance with FIG. 3 shows in particular, the U-shaped attachment clamp 30 has a receptacle 36, which is correspondingly designed as a dovetailed receptacle for the attachment strip 15. The lateral legs 32 and 33 enclose this receptacle 36 and extend with projections 34 and 35 behind the attachment strip 15. Behind the received attachment strip 15, the receptacle 36 has a deepened groove bottom, which extends as far as the base leg 31. The base leg 31 is narrow and has an appropriate flexibility, so that the lateral legs 32 and 33 are slightly spread apart while being lockingly pushed on the attachment strip 15. In addition to the received attachment strip 15, the lateral legs 32 and 33 have attachment receptacles 37 and 38 oriented toward each other, through which the attachment screw can be conducted. The lateral legs 32 and 33 can be clamped to the attachment strip 15 by means of the attachment screw and the attachment screw can be positioned in this way. In the process the attachment screw can be simultaneously screwed into an attachment surface, if the attachment surface has a threaded receptacle. The screw head of the attachment screw is supported on the exterior of the lateral leg 33 of the attachment clamp 30. Clamping is improved because the distance of the attachment strip 15 from the exterior of the lower housing element 10 and the thickness of the lateral leg 32 with the support strips 41 and 40 is selected in such a way that the exteriors of the bottom of the lower housing element and the lateral leg 32 are located in one attachment plane together with the support strips 41 and 40, since in this case the lateral leg 32 is used as counter-support.

As indicated by element reference numeral 38' in FIG. 2, the attachment receptacles in the lateral legs 32 and 33 can also be embodied as elongated holes covering each other, each having a longitudinal dimension oriented transversely with respect to the longitudinal direction of the attachment strips 15. Thus, the attachment point can also be changed to a certain extent perpendicularly with respect to the lateral walls 13 of the lower housing element 10. An attachment screw, which is inserted through a bore in the attachment surface, passes through the attachment receptacles 38 and 37 of the attachment clamp 30 and receives a nut above the lateral leg 33, can also perform the clamping of the attachment clamp 30 on the attachment strip 15. If the attachment receptacle 37 is designed as a threaded bore, the nut can be omitted.

Finally, an attachment receptacle, for example 38, can also have a depression, enlarged in cross section, on the exterior of the associated lateral leg 32 for the countersunk reception of a screw head of the attachment screw. The attachment clamp 30 can also have lateral legs 32 and 33 of equal thickness and can be lockingly attached in two positions, which are offset by 180°, to the attachment strip 15, which can also have a different cross section with an undercut.

What is claimed is:

1. In a small housing having a lower housing element, a housing cover and two front plates, wherein the lower housing element and the housing cover are sections of extruded profiles each having a U-shaped cross section, wherein the front plates close off open front faces of the assembled housing, the lower housing element is connected with the housing cover, wherein the lower housing element has attachment elements for placing the small housing on an attachment surface, the improvement comprising:

a plurality of exteriors of a plurality of lateral walls (13) of the lower housing element (10) having a plurality of longitudinally oriented and undercut attachment strips (15);

a plurality of attachment clamps (30) each having a generally U-shaped cross section and an undercut receptacle (36) engageable with a corresponding one of the attachment strips (15);

a plurality of lateral legs (32, 33) of each of the attachment clamps (30) enclosing the undercut receptacle (36) positioned at an outside of the attachment strip (15) and having a plurality of attachment receptacles (37, 38) aligned with each other; and wherein the front plates cover the open front faces of the attachment strips (15) at the fronts of the housing.

2. In the housing in accordance with claim 1, wherein each of the attachment clamps (30) is pushed on one of the attachment strips (15) in a longitudinal direction of the attachment strips (15).

3. In the housing in accordance with claim 1, wherein each of the attachment clamps (30) is lockingly fastened on one of the attachment strips (15) in a transverse direction of the attachment strips (15).

4. In the housing in accordance with claim 3, wherein the lateral legs (32, 33) of the attachment clamp (30) have the attachment receptacles (37, 38) embodied as bores.

5. In the housing in accordance with claim 3, wherein the attachment receptacles (38') in the lateral legs (32, 33) are embodied as holes having a longitudinal dimension oriented transversely with respect to the longitudinal direction of the attachment strips (15).

6. In the housing in accordance with claim 3, wherein the lateral legs (32, 33) of the attachment clamp (30) have at least one attachment receptacle embodied as a threaded bore.

7. In the housing in accordance with claim 6, wherein the attachment strips (15) are arranged at a distance from the exterior of the bottom of the lower housing element (10), and a thickness of at least one of the lateral legs (32, 33) of the attachment clamp (30) is sized so that the attachment clamp (30) ends flush with the exterior of the bottom of the lower housing element (10).

8. In the housing in accordance with claim 7, wherein the attachment receptacle has a recess with an enlarged cross section for a countersunk reception of a screw head of an attachment screw.

9. In the housing in accordance with claim 8, wherein an interior of the lower housing element (10) and an interior of the housing cover (20) have a plurality of longitudinally oriented screw channels (11, 21), and the front plates are screwed together with the screw channels (11, 21) of the housing cover (10) placed on the lower housing element (10).

10. In the housing in accordance with claim 9, wherein the attachment strips (15) are embodied as dovetailed strips and the receptacles (36) of the attachment clamps (30) are each embodied as a dovetailed groove with a deepened groove bottom.

11. In the housing in accordance with claim 1, wherein the lateral legs (32, 33) of the attachment clamp (30) have the attachment receptacles (37, 38) embodied as bores.

12. In the housing in accordance with claim 1, wherein the attachment receptacles (38') in the lateral legs (32, 33) are embodied as holes having a longitudinal dimension oriented transversely with respect to a longitudinal direction of the attachment strips (15).

13. In the housing in accordance with claim 1, wherein the lateral legs (32, 33) of the attachment clamp (30) have at least one attachment receptacle embodied as a threaded bore.

14. In the housing in accordance with claim 1, wherein the attachment strips (15) are arranged at a distance from an exterior of a bottom of the lower housing element (10), and a thickness of at least one of the lateral legs (32, 33) of the attachment clamp (30) is sized so that the attachment clamp (30) ends flush with the exterior of the bottom of the lower housing element (10).

15. In the housing in accordance with claim 1, wherein the attachment receptacle has a recess with an enlarged cross section for a countersunk reception of a screw head of an attachment screw.

16. In the housing in accordance with claim 1, wherein an interior of the lower housing element (10) and an interior of the housing cover (20) have a plurality of longitudinally oriented screw channels (11, 21), and the front plates are screwed together with the screw channels (11, 21) of the housing cover (10) placed on the lower housing element (10).

17. In the housing in accordance with claim 1, wherein the attachment strips (15) are embodied as dovetailed strips and the receptacles (36) of the attachment clamps (30) are embodied as a dovetailed groove with a deepened groove bottom.

* * * * *